(12) United States Patent
Yang et al.

(10) Patent No.: US 9,659,879 B1
(45) Date of Patent: May 23, 2017

(54) SEMICONDUCTOR DEVICE HAVING A GUARD RING

(71) Applicant: TAIWAN SEMICONDUCTOR MANUFACTURING COMPANY LTD., Hsinchu (TW)

(72) Inventors: Ching-Feng Yang, Taipei (TW); Chun-Lin Lu, Hsinchu (TW); Kai-Chiang Wu, Hsinchu (TW); Vincent Chen, Taipei (TW)

(73) Assignee: TAIWAN SEMICONDUCTOR MANUFACTURING COMPANY, Hsinchu (TW)

( * ) Notice: Subject to any disclaimer, the term of this patent is extended or adjusted under 35 U.S.C. 154(b) by 0 days.

(21) Appl. No.: 14/928,664

(22) Filed: Oct. 30, 2015

(51) Int. Cl.
*H01L 23/52* (2006.01)
*H01L 23/31* (2006.01)
*H01L 23/49* (2006.01)
*H01L 23/62* (2006.01)
*H01L 23/552* (2006.01)
*H01L 23/00* (2006.01)
*H01L 23/498* (2006.01)

(52) U.S. Cl.
CPC ........ *H01L 23/552* (2013.01); *H01L 23/3142* (2013.01); *H01L 23/3157* (2013.01); *H01L 23/49811* (2013.01); *H01L 23/49827* (2013.01); *H01L 23/49838* (2013.01); *H01L 23/562* (2013.01)

(58) Field of Classification Search
CPC ............... H01L 23/552; H01L 23/3142; H01L 23/3157; H01L 23/49811; H01L 23/49827; H01L 23/49838; H01L 23/562
See application file for complete search history.

(56) References Cited

U.S. PATENT DOCUMENTS

| | | | | |
|---|---|---|---|---|
| 7,923,297 B2* | 4/2011 | Izumi | ..................... | B28D 5/022 438/113 |
| 8,373,243 B2* | 2/2013 | Tai | ..................... | H01L 27/14636 257/291 |
| 8,525,278 B2* | 9/2013 | Chu | ........................ | H01L 24/81 257/415 |
| 8,643,128 B2* | 2/2014 | Wang | .................. | B81C 1/00246 216/11 |
| 8,686,532 B2* | 4/2014 | Nakashiba | ...... | H01L 21/823878 257/495 |
| 8,716,109 B2* | 5/2014 | Ni | ......................... | B81B 7/0051 438/113 |
| 8,742,596 B2* | 6/2014 | Hirano | .................. | H01L 23/522 257/777 |
| 8,809,120 B2* | 8/2014 | Miccoli | ............. | B23K 26/0057 438/113 |

(Continued)

*Primary Examiner* — Ida M Soward
(74) *Attorney, Agent, or Firm* — WPAT, P.C.; Anthony King

(57) ABSTRACT

A semiconductor device includes a semiconductor die having a guard ring disposed in a periphery of the semiconductor die. The semiconductor device also includes a conductive pad over the guard ring. the semiconductor device further has a passivation partially covering the conductive pad, and including a recess to expose a portion of the conductive pad and a post passivation interconnect (PPI) over the passivation. In the semiconductor device, a conductor is extended upwardly from the recess and connected to a portion of the PPI.

20 Claims, 19 Drawing Sheets

(56) References Cited

U.S. PATENT DOCUMENTS

| | | | | |
|---|---|---|---|---|
| 8,890,268 | B2* | 11/2014 | Huang | H01L 23/3171 257/431 |
| 9,214,411 | B2* | 12/2015 | Park | H01L 23/481 |
| 9,224,694 | B2* | 12/2015 | Pagani | H01L 23/544 |
| 9,305,968 | B2* | 4/2016 | Qian | H01L 27/14618 |
| 2007/0023920 | A1* | 2/2007 | Jao | H01L 23/367 257/778 |
| 2007/0090447 | A1* | 4/2007 | Morimoto | H01L 21/768 257/316 |
| 2010/0301459 | A1* | 12/2010 | Akiba | H01L 24/03 257/620 |
| 2011/0057297 | A1* | 3/2011 | Lee | H01L 23/562 257/620 |
| 2014/0151838 | A1* | 6/2014 | Iizuka | H01L 27/14636 257/433 |
| 2014/0183690 | A1* | 7/2014 | Lii | H01L 23/3192 257/531 |
| 2014/0329373 | A1* | 11/2014 | Miccoli | B23K 26/0057 438/463 |
| 2015/0079762 | A1* | 3/2015 | Nakagawa | H01L 21/78 438/463 |
| 2015/0228752 | A1* | 8/2015 | Kirisawa | H01L 29/66128 438/478 |
| 2015/0255551 | A1* | 9/2015 | Kerber | H01L 23/5227 257/488 |
| 2015/0270229 | A1* | 9/2015 | Kang | H01L 23/562 257/508 |
| 2015/0311133 | A1* | 10/2015 | Tomita | H01L 23/3192 257/487 |
| 2015/0325533 | A1* | 11/2015 | Yu | H01L 23/585 257/773 |
| 2016/0020181 | A1* | 1/2016 | Yu | H01L 23/585 257/737 |
| 2016/0126324 | A1* | 5/2016 | Yu | H01L 29/402 257/503 |
| 2016/0204074 | A1* | 7/2016 | Lin | H01L 21/784 257/76 |

* cited by examiner

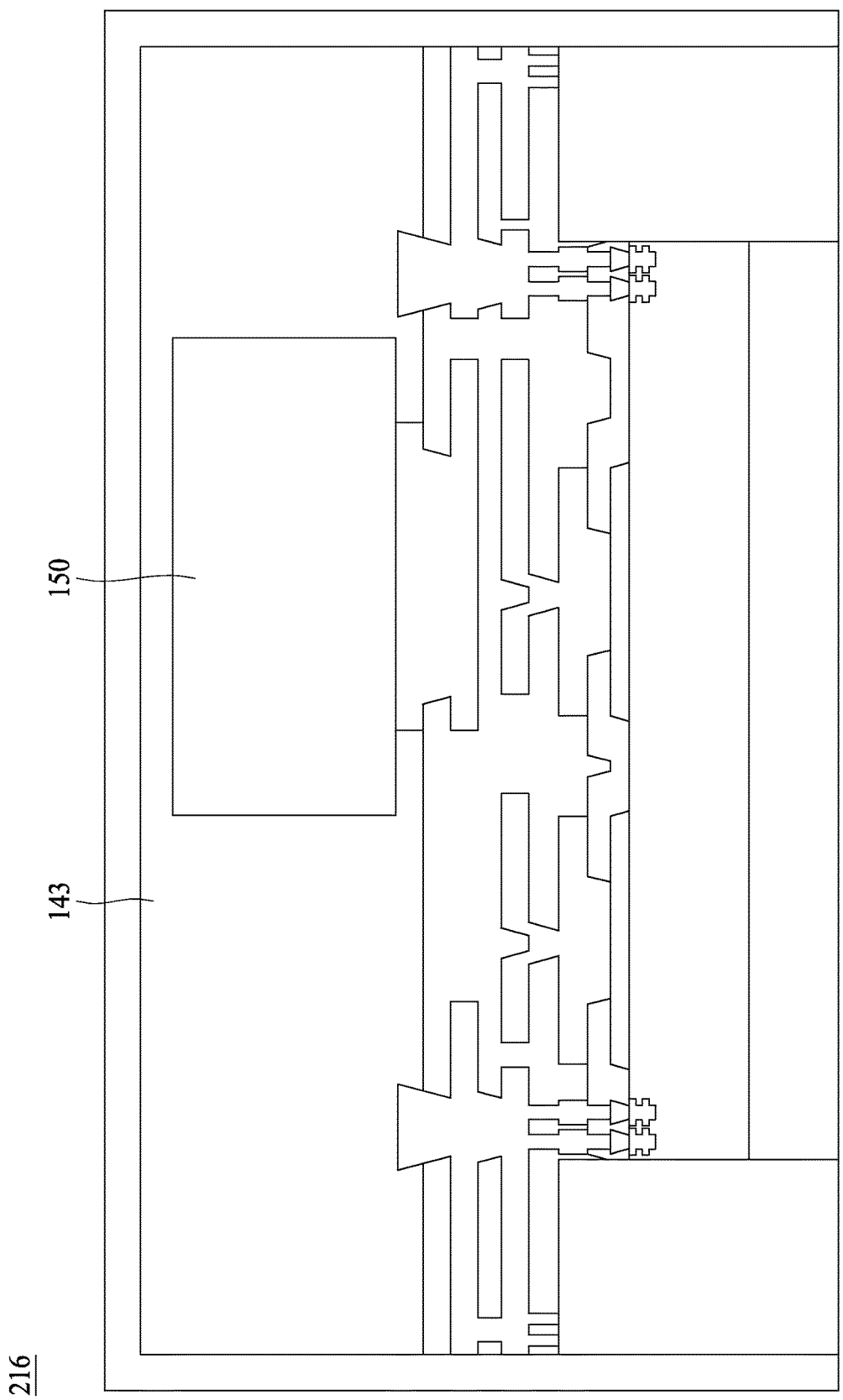

SEMICONDUCTOR DEVICE HAVING A GUARD RING

FIELD

The disclosure relates to a semiconductor device and a method of manufacturing a semiconductor device.

BACKGROUND

Electronic equipments involving semiconductor devices are indispensable from our daily life. With the advancement of electronic technology, electronic equipments become more complicated and involve greater amount of integrated circuitry for executing the desired multi-functionality. Thus, manufacturing of the electronic equipments includes more and more steps of assembly and processing as well as materials for producing the semiconductor devices in the electronic equipments. Therefore, there is a continuous demand on simplifying the steps of production, increasing production efficiency and lowering associated manufacturing cost on each electronic equipment.

During the operations of manufacturing the semiconductor devices, the semiconductor devices are assembled with numbers of integrated components including various materials with difference in thermal properties. As such, the integrated components are in undesired configurations after curing of the semiconductor device. The undesired configurations would lead to yield loss of the semiconductor devices, poor bondability between the components, development of cracks, delamination of the components or etc. Furthermore, the components of the semiconductor devices include various metallic materials which are in limited quantity and thus in a high cost. The undesired configurations of the components and the yield loss of the semiconductor devices would further exacerbate materials wastage and thus the manufacturing cost would increase.

As more different components with different materials are involved and a complexity of the manufacturing operations of the semiconductor device is increased, there are more challenges to modify a structure of the semiconductor device and improve the manufacturing operations. As such, there is a continuous need to improve the method for manufacturing the semiconductor and solve the above deficiencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
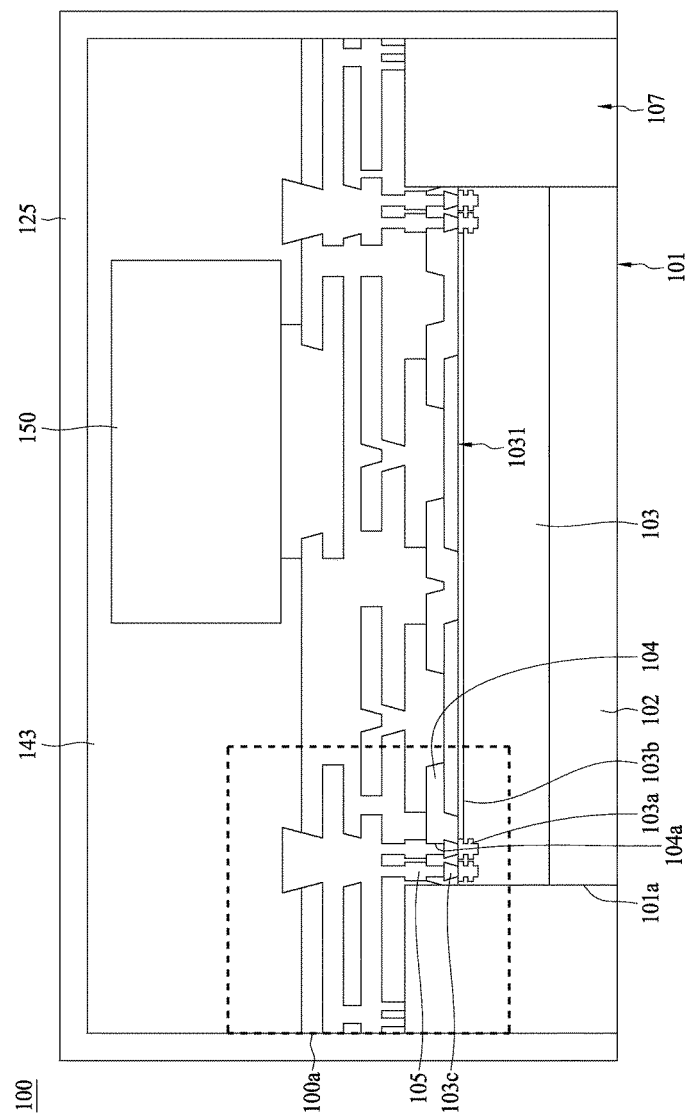
FIG. 1 is an anti-EMI semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a semiconductor device is provided to have a shield for protecting a semiconductor component from external EMI (Electromagnetic Interference) disturbance. The semiconductor component is manufactured from a wafer level package by utilizing fan-in or fan-out technical operations. The shield is electrically coupled to a guard ring through conductive via, or post passivation interconnect (PPI). Further, the shield is also coupled to a ground terminal of the semiconductor device. In some embodiments, the shield is grounded through the guard ring.

In FIG. 1, an anti-EMI semiconductor device 100 is illustrated. In some embodiments, the semiconductor device 100 includes a semiconductor die 101. The semiconductor die 101 includes a semiconductor substrate 102 and interconnection 103 over the semiconductor substrate 102. In some embodiments, the semiconductor substrate 102 includes semiconductor materials such as silicon, and is fabricated to have a predetermined functional circuit within the semiconductor die 101. The semiconductor die 101 is produced by various operations such as photolithography, etch, deposition, plating, etc. In some embodiments, the semiconductor die 101 is singulated from a silicon wafer by a mechanical or laser blade. In some embodiments, the semiconductor die 101 is in a quadrilateral, a rectangular or a square shape.

In some embodiments, the semiconductor die 101 includes conductive guard ring 103a proximal to an edge of semiconductor die 101. The guard ring 103a may circumscribe around the edge of semiconductor die 101. In some embodiments, guard ring 103a is configured as a retaining wall around the periphery of the semiconductor die 101 in order to protect the circuit components from mechanical damage both during assembly and in operation. The periphery is defined as a region proximal to an edge like sidewall 101a of the semiconductor die 101. In some embodiments, guard ring 103a protects die edge 101a from the diffusion of moisture and mobile ions into die 101. In some embodiments, guard ring 103a may be further connected to a ground terminal of device 100.

Guard ring 103a is a portion of the interconnection 103, and is usually disposed proximal to the molding 107 compared to other conductive traces or vias in the interconnection 103. In some embodiments, guard ring 103a is free from connecting with any input or output (I/O) circuitry in the interconnection 103. In some embodiments, guard ring 103a is a multi-leveled conductive structure stacking with edge of each level being aligned.

The guard ring 103a is extended to a top level dielectric 1031 of the interconnection 103 and exposed from the top level dielectric 1031. In some embodiments, top level dielectric 1031 includes oxide such as silicon oxide or some low k (dielectric constant) value dielectric. In the disclosure, low k value dielectric stands for dielectric having k value under 3.3 or more. In some embodiments, the k value is not greater than 2.8.

A portion of the top level dielectric 1031 is beneath passivation 104 of semiconductor die 101. Passivation 104 is also a dielectric material and usually includes at least a nitrogen containing layer to protect the substrate 102 and interconnection 103 from moisture or chemical into semiconductor die 101. In some embodiments, passivation 104 is disposed over a top surface 103b of the top level dielectric 1031. Passivation 104 may be also in contact with the top surface 103b.

The semiconductor die 101 also includes conductive pads above top surface 103b (or over the top level dielectric 1031). An edge of each conductive pad is surrounded by passivation 104. Each conductive pad is also partially exposed from passivation 104. In some embodiments, a portion of top surface 103d of the conductive pad is exposed from passivation 104. Some of the conductive pads are configured as terminals to be connected with a conductive trace external to semiconductor die 101. In some embodiments, the semiconductor die 101 includes at least a conductive pad 103c connected to guard ring 103a. Conductive pad 103c is disposed proximal to die edge 101a. The conductive pad 103c may follow the route pattern of the guard ring. In some embodiments, conductive pad 103c is a loop circumscribing die edge 101a. The conductive pad 103c acts as an upper level guard ring and has at least a surface exposed from passivation 104 for further connection. In some embodiments, the conductive pad 103c includes gold, silver, copper, nickel, tungsten, aluminum, palladium and/or alloys thereof.

Figure 1A:
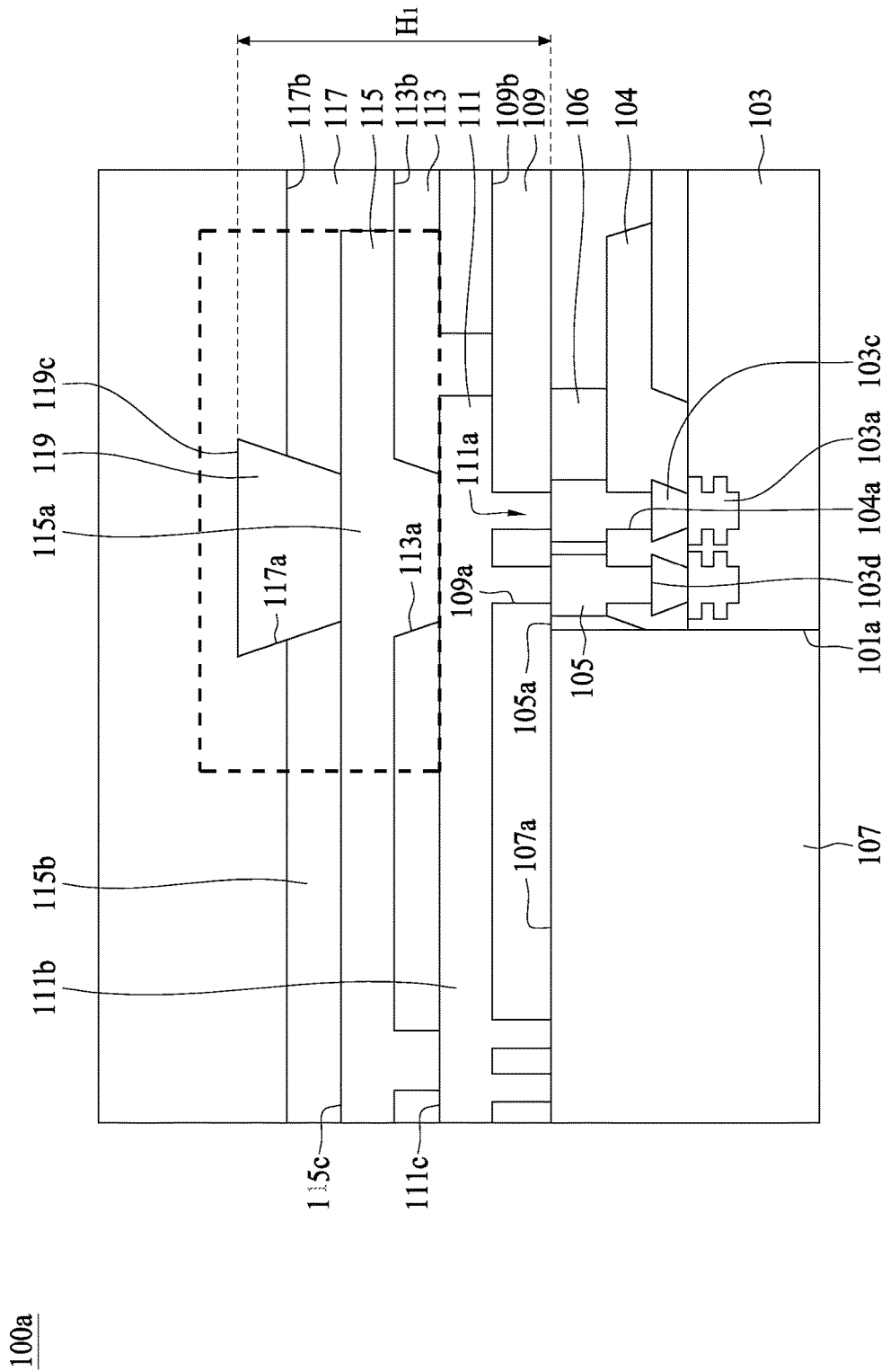
FIG. 1A is an enlarged view of a portion of a semiconductor device in FIG. 1 in accordance with some embodiments.

FIG. 1A is an enlarged view of a portion 100a of the semiconductor device 100 in FIG. 1. Passivation 104 is continuously extended to be proximal to die edge 101a. However, there are several recesses features in passivation 104 and each of the recess may be corresponding to a conductive pad. As shown in the FIG. 1A, each conductive pad (like 103c) is exposed from corresponding recess.

In some embodiments, the passivation 104 partially covers a top surface 103d of the conductive pad 103c. The passivation 104 is configured for providing an electrical insulation and a moisture protection for the semiconductor die 101, so that the semiconductor die 101 is isolated from ambient environment. In some embodiments, the passivation 104 is formed with dielectric materials such as spin-on glass (SOG), silicon oxide, silicon oxynitride, silicon nitride or the like. In some embodiments, the passivation 104 is formed with a vapor deposition or a spin coating process.

Still referring to FIG. 1A, Conductor 105 is in the recess of passivation 104 and disposed over the top surface 103d of the conductive pad 103c. Conductor 105 is electrically coupled to guard ring 103a via conductive pad 103c. In some embodiments, the conductor 105 is on an exposed portion of the top surface 103d. Conductor 105 is extended from the top surface 103d and through the thickness of passivation 104. In some embodiments, the conductor 105 is extended along a normal direction of the top surface 103b of the interconnection 103. In some embodiments, the conductor 105 is substantially upright and supported by the conductive pad 103c. The conductor 105 may fill the recess corresponding to the conductive pad 103c.

In some embodiments, conductor 105 may follow the route of the conductive pad 103c and disposed proximal to die edge 101a. In some embodiments, conductor 105 is a loop circumscribing die edge 101a. The conductive pad 103c acts as another upper level guard ring and extended from the recess of passivation 104. In some embodiments, the conductor 105 includes gold, silver, copper, nickel, tungsten, aluminum, palladium and/or alloys thereof.

Dielectric 106 is disposed over the passivation 104 and surrounding the conductor 105. The dielectric 106 is a dielectric filling inserted around the conductor 105 in order to isolate adjacent conductors or avoid moisture attack. In some embodiments, the dielectric 106 includes a material such as epoxy, polyimide, polybenzoxazole (PBO), solder resist (SR), ABF film, and the like. In some embodiments, dielectric 106 includes photosensitive material and may undergo chemical reactions when exposed to light. In some embodiments, the conductor 105 is extended and exposed from a surface of dielectric 106.

Molding 107 is adjacent die edge 101a. In some embodiments, die edge 101a is an interface between molding 107 and semiconductor die 101. Molding 107 is a dielectric material and configured to surround sidewalls of the semiconductor die 101 and also provide some mechanical support in some embodiments. Molding 107 is configured to be in contact with the EMI shield 125 in FIG. 1 at a first surface and be in contact with die edge 101a at a second surface. In some embodiments, the first surface is opposite to the second surface. The molding material is a compound and formed with composite materials including epoxy resins, phenolic hardeners, silicas, catalysts, pigments, and mold release agents. Material that is adopted for forming a molding compound has a high thermal conductivity, a low moisture absorption rate, a high flexural strength at board-mounting temperatures, or a combination of all. In some embodiments, a surface of the conductor 105, dielectric 106 and the molding 107 are substantially coplanar. A surface 105a of the conductor 105 is coplanar with a surface 107a of the molding 107. Surface 105a is the surface exposed from dielectric 106. Surface 107a is the surface interfacing with dielectric 109.

Dielectric 109 is disposed over the molding 107, the conductor 105 and the dielectric 106. The dielectric 109 is disposed on top surfaces of the molding 107, the conductor 105 and the dielectric 106. In some embodiments, the dielectric 109 includes a polymeric material such as epoxy, polyimide, polybenzoxazole (PBO), solder resist (SR), ABF film, and the like. In some embodiments, the dielectric 109 includes photosensitive material and may undergo chemical reactions when exposed to light.

Dielectric 109 is also disposed between a conductive trace 111 and dielectric 106. Conductive trace 111 is a portion of a redistribution layer (RDL) or post passivation interconnect (PPI). The conductive trace 111 is electrical conductive and configured as an intermediate path between conductor 105 and a conductive trace external to the semiconductor die 101. In some embodiments, The RDL 111 includes via portion 111a and lateral portion 111b. The via portion 111a is connected with the conductor 105 through the recess 109a of dielectric 109. Via portion 111a is also extended upwardly to connect with lateral portion 111b. In some embodiments, via portion 111a is conformally lining along the recess 109a of the dielectric 109.

In some embodiments, conductive trace 111 is partially covered by a dielectric 113, which is designed to isolate the conductive trace 111 from moisture or reaction. However, at least a portion of the conductive trace 111 is exposed from the dielectric 113. Dielectric 113 is patterned to have recess 113a to expose a portion of the conductive trace 111 so as to provide a top surface 111c to be in contact with another conductive feature. In some embodiments, the exposed portion is at an edge of dielectric 117. In some embodiments, the edge is also a sidewall of semiconductor device 100. In some embodiments, the dielectric 113 includes a polymeric material such as epoxy, polyimide, polybenzoxazole (PBO), solder resist (SR), ABF film, and the like. In some embodiments, the dielectric 113 includes photosensitive material and may undergo chemical reactions when exposed to light.

Through the recess 113a, conductive trace 111 is configured to be connected with another conductive feature 115. Conductive feature 115 is also a portion of RDL or PPI. Conductive feature 115 provides an intermediate path between conductive trace 111 and other conductive features external to the semiconductor die 101. In some embodiments, conductive feature 115 is similar to conductive trace 111 and includes a via portion 115a and lateral portion 115b. The via portion 115a is connected with the conductive trace 111 through the recess 113a and extended upwardly to a top surface 115c of conductive feature 115. In some embodiments, the via portion 115a is stacked over the via portion 111a. In some embodiments, the vertical portion 115a is conformally lining along the recess 113a of the dielectric 113.

Alternatively, conductive feature 115 can be partially covered by a dielectric 117, which is designed to isolate conductive feature 115 from moisture or reaction. However, at least a portion of conductive feature 115 is exposed from dielectric 117. The exposed portion is at an edge of dielectric 117. In some embodiments, the edge is also a sidewall of semiconductor device 100. In some embodiments, dielectric 117 includes a polymeric material such as epoxy, polyimide, polybenzoxazole (PBO), solder resist (SR), ABF film, and the like. In some embodiments, the dielectric 117 includes photosensitive material and may undergo chemical reactions when exposed to light.

In some embodiments, conductive trace 111 or conductive feature 115 is configured as a seal ring of the packaged semiconductor device 100. As a seal ring, conductive trace 111 or conductive feature 115 is disposed at a periphery of the semiconductor device 100. Conductive trace 111 or conductive feature 115 is circumscribing sidewalls of semiconductor device 100. Layout of conductive trace 111 or conductive feature 115 is in loop configuration from a top view perspective.

Lateral portion of conductive trace 111 or conductive feature 115 is extended to be laterally further exceeding die edge 101a of semiconductor die 101. The lateral portion has at least a conductive surface exposed from sidewall of device 100 in order to be electrically coupled to an EMI shield. In some embodiments, conductive trace 111 or conductive feature 115 is designed to be electrically isolated from any input or output (I/O) circuitry or other active circuitry of device 100, thus also called dummy conductive RDL or PPI. Nevertheless, conductive trace 111 or conductive feature 115 is configured to be a ground path to be connected to the EMI shield.

The ground path of EMI shield incorporates several main conductive structures built inside device 100. The main conductive structures are arranged in several different tiers or levels of device 100. One ground path, conductive trace 111 or conductive feature 115, is in the RDL and PPI level. Another ground path, guard ring 103a, is in die 101 level.

Referring back to FIG. 1, electronic component 150, such as a semiconductor die, is stacked over die 101. Electronic component 150 is electrically communicated with die 101 via a portion of the PPI or RDL. The stacking direction is substantially parallel to the extension direction of conductor 105. Electronic component 150 may be flipped and bonded to an active conductive trace of PPI or RDL. Molding 143 surrounds electronic component 150 and isolates moisture or charges entering into electronic component 150. A 3D (three dimensional) molded semiconductor structure is formed inside the EMI shield 125.

Figure 2:
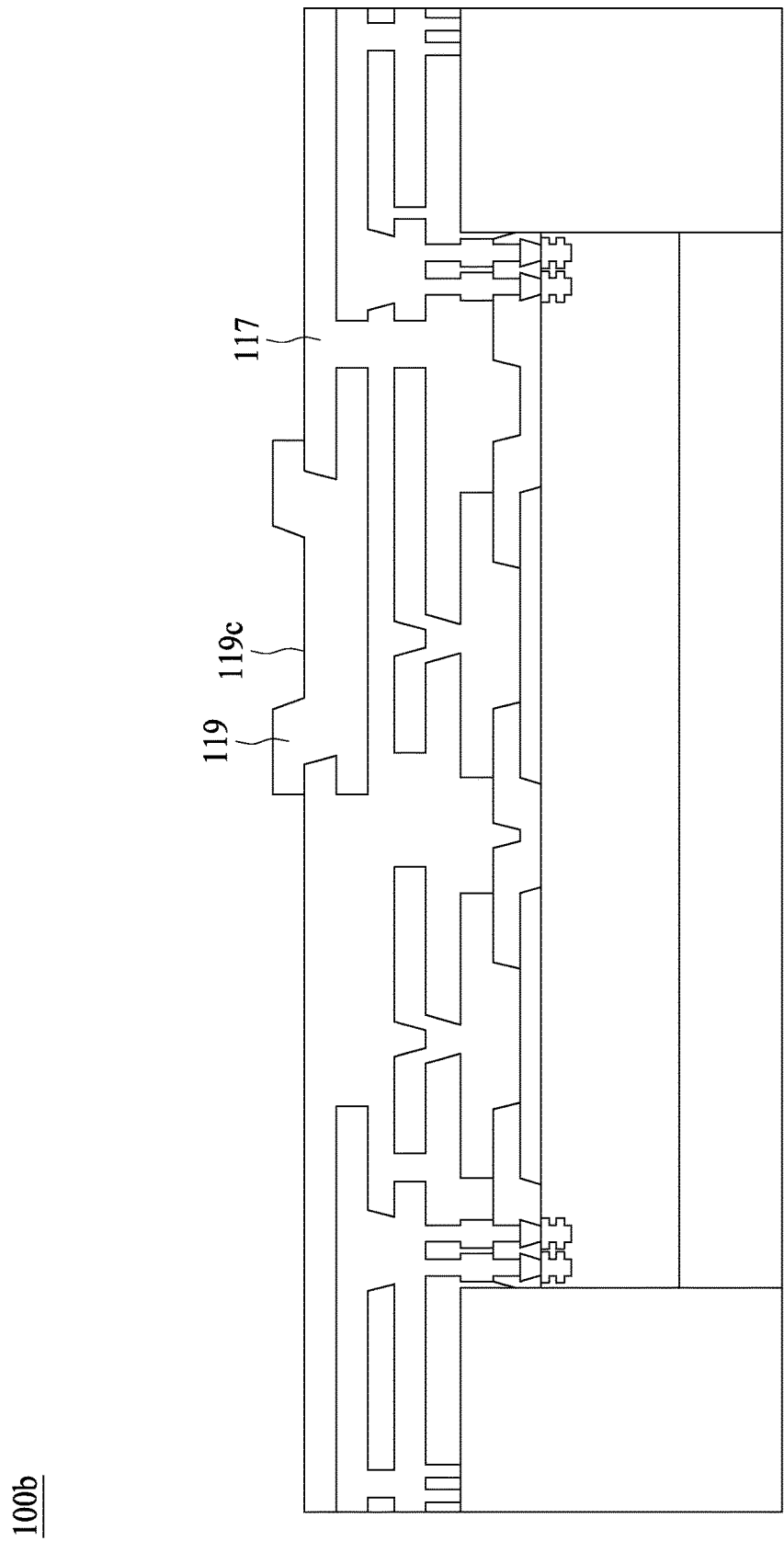
FIG. 2 is an anti-EMI semiconductor device in accordance with some embodiments.

An anti-EMI semiconductor device 100b is illustrated as In FIG. 2. The semiconductor device 100b includes a structure similar to the semiconductor 100 in FIG. 1 such that details of the elements indicated with the same numerical labels are not repeated herein. In FIG. 2, PPI has a conductive feature 119 exposed from dielectric 117. Surface 119c of conductive feature 119 is configured to be connected with a conductor such as a solder bump or solder paste.

Figure 3A:
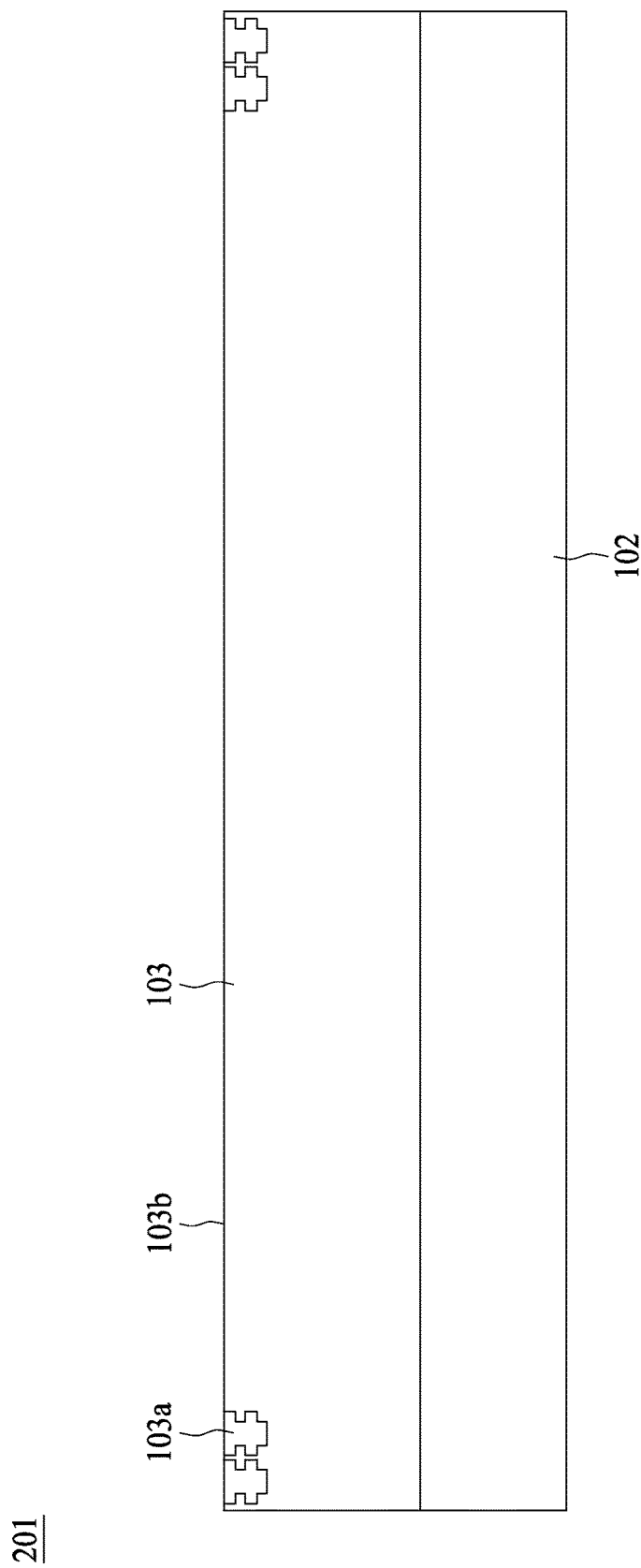
FIG. 3A-FIG. 3P represent a flow diagram of a method of manufacturing an anti-EMI semiconductor device in accordance with some embodiments.

FIG. 3A-FIG. 3P include operations of a method of manufacturing the semiconductor device 100 in FIG. 1. The method includes a number of operations (201, 202, 203, 204, 205, 206, 207, 208, 209, 210, 211, 212, 213, 214, 215 and 216).

In operation 201, a semiconductor substrate 102 is provided as in FIG. 3A. In some embodiments, the semiconductor substrate 102 includes semiconductor material such as silicon. In some embodiments, an interconnection 103 is disposed over the semiconductor substrate 102. In the process of disposing the interconnection 103, it further includes disposing a guard ring 103a in a periphery of the interconnection 103 and extending the guard ring 103a to a top surface 103b of the interconnection 103 as in FIG. 3A.

Figure 3B:
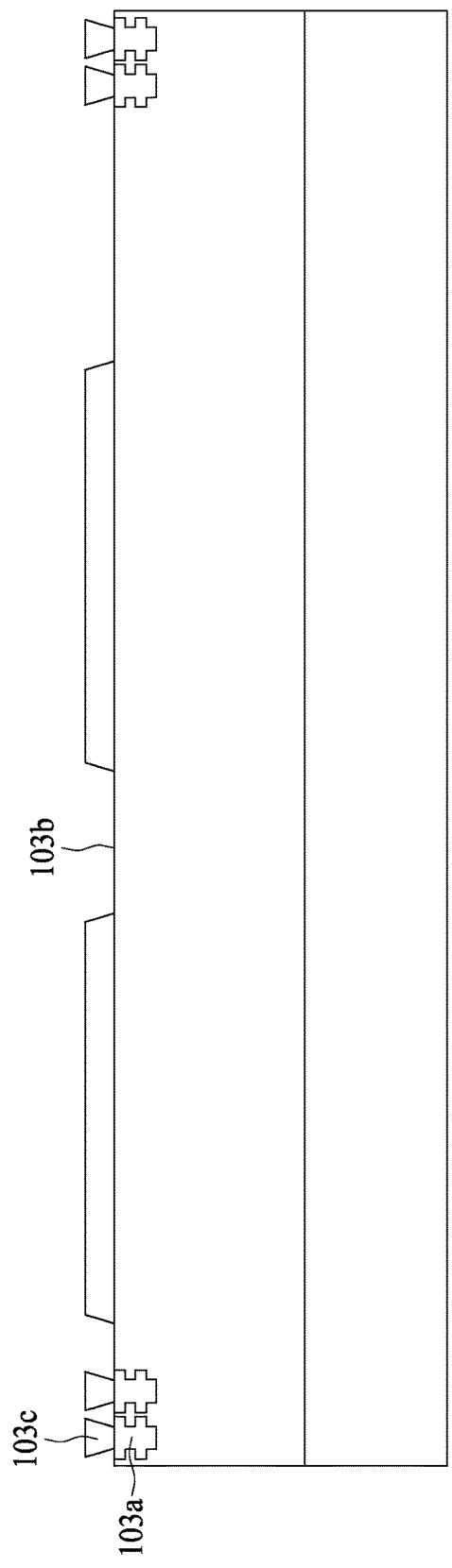
Figure 3C:
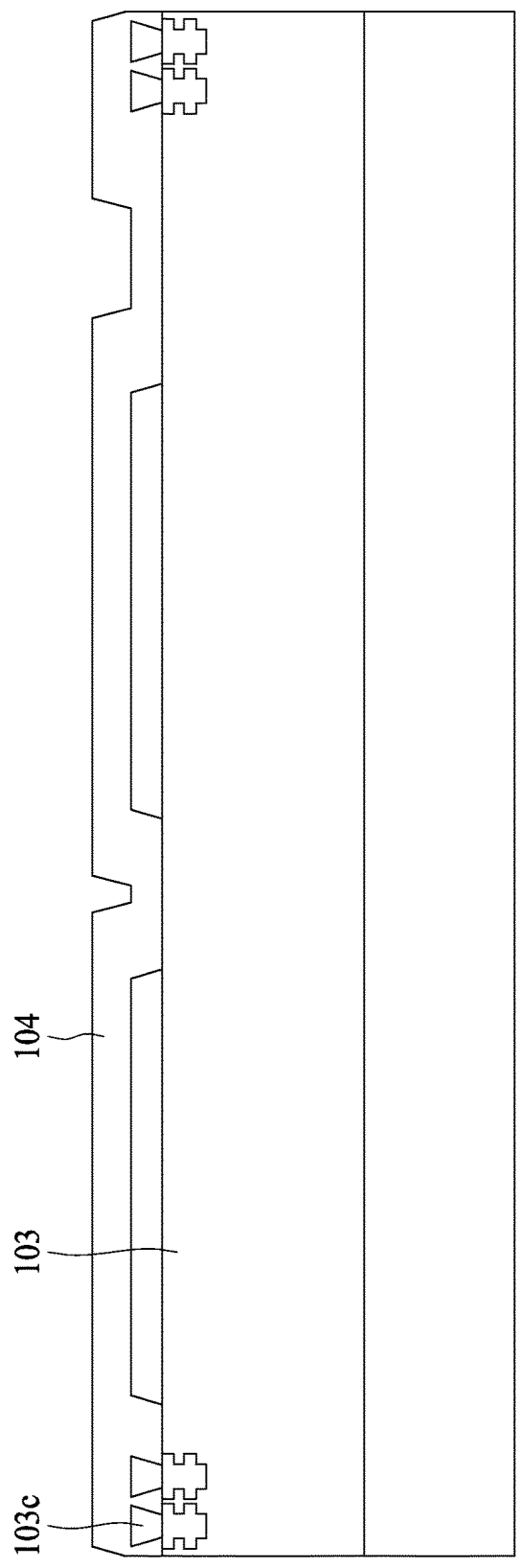

In operation 202, a conductive pad 103c is formed on the guard ring 103a as in FIG. 3B. In some embodiments, the conductive pad 103c is disposed on a surface 103b of the interconnection 103. In operation 203 as in FIG. 3C, a passivation 104 is disposed over the interconnection 103 and the conductive pad 103c.

Figure 3D:
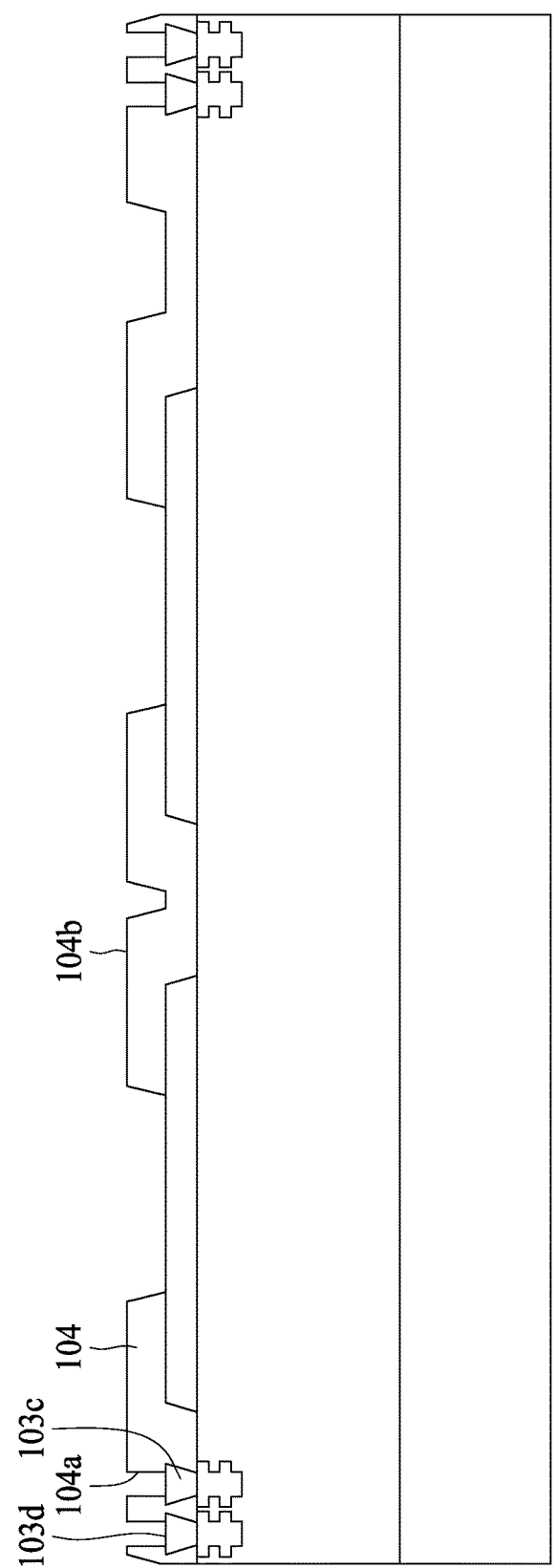

In operation 204 as in FIG. 3D, passivation 104 is partially removed to form a recess 104a. Some portions of passivation 104 above a top surface 103d of the conductive pad 103c is removed by etching operations to expose the top surface 103d of the conductive pad 103c and form the recess 104a. In some embodiments, the recess 104a is extended from a top surface 104b of the passivation 104 to the top surface 103d of the conductive pad 103c.

Figure 3E:
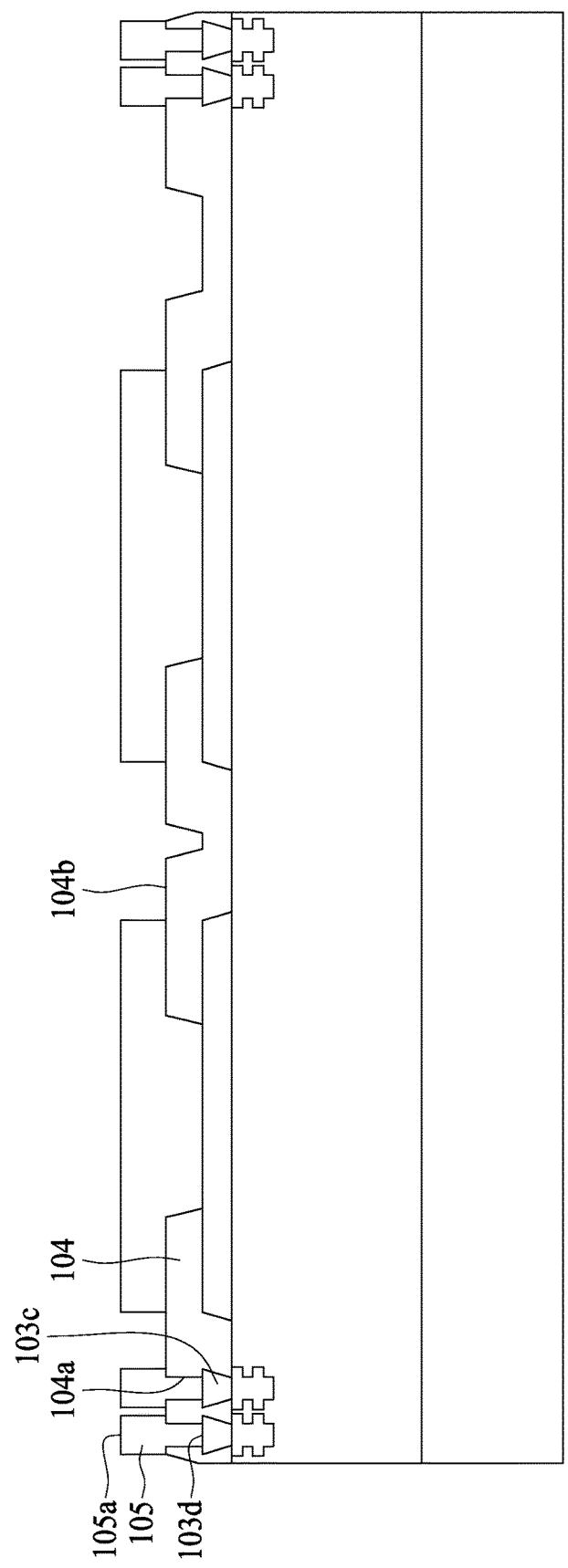

In operation 205, a conductor 105 is disposed over the conductive pad 103c and partially covering the passivation 104 as in FIG. 3E. In some embodiments, the conductor 105 fills in the recess 104a. In some embodiments, the conductor 105 is extended from the top surface 103d of the conductive pad 103c to a top surface 105a of the conductor 105. In some embodiments, the conductor 105 is substantially upright and supported by the conductive pad 103c. In some embodiments, the conductor 105 is disposed by various methods such as electroplating, sputtering or etc. In some embodiments, the conductor 105 includes a metal such as copper, silver, gold, or alloy thereof.

Figure 3F:
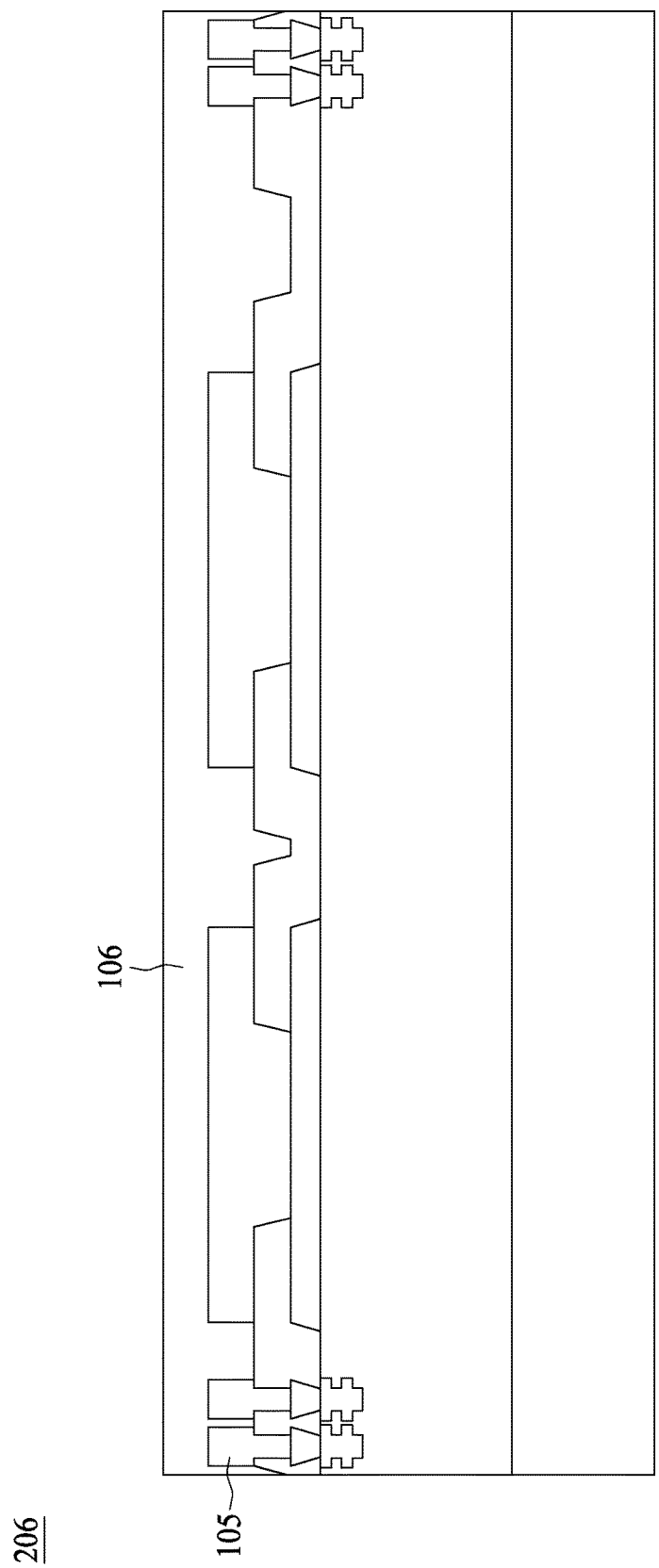

In operation 206, a dielectric 106 is disposed around the conductor 105 as in FIG. 3F. In some embodiments, the dielectric 106 surrounds the conductor 105. The dielectric 106 is configured to insulate the conductor 105 from ambient.

Figure 3G:
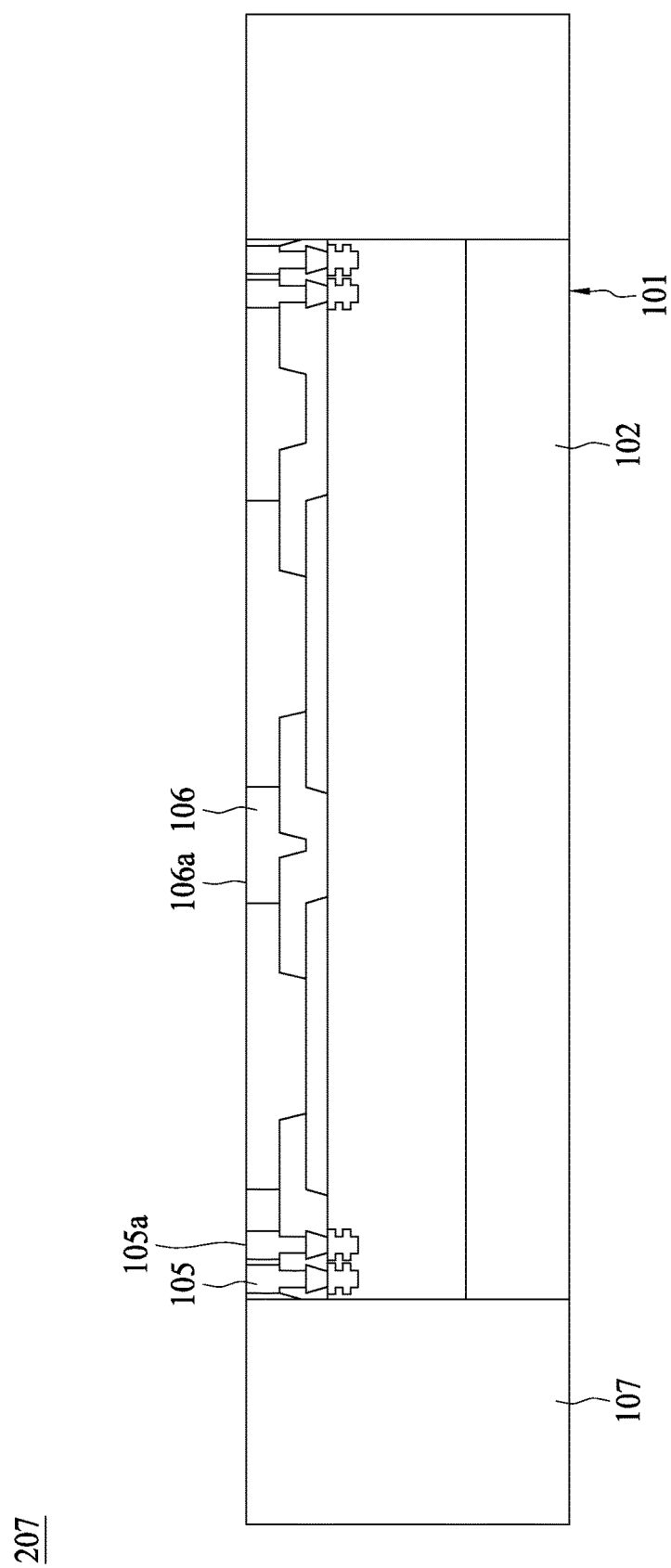

In operation 207, the semiconductor substrate 102 is singulated into several individual dies 101. In some embodiments, the semiconductor substrate 102 is singulated by a mechanical or laser blade. The die 101 singulated from the semiconductor substrate 102 is placed on a carrier (not shown). A molding 107 is formed on the carrier to surround the die 101. A removal or planarization operation is introduced to remove a portion of the molding 107 in order to expose top surface 105a of the conductor 105 and top surface 106a of the dielectric 106, such that there is no molding 107 remaining on the conductor 105 and the dielectric 106. FIG. 3G is an embodiment showing the structure after the removal operation. In some embodiments, the top portions of the molding 107, the conductor 105, and the dielectric 106 are concurrently removed by an operation such as etching or grinding in order to be coplanar. In some embodiments, there are through vias (not shown) formed in the molding 107 and adjacent to the die 101.

Figure 3H:
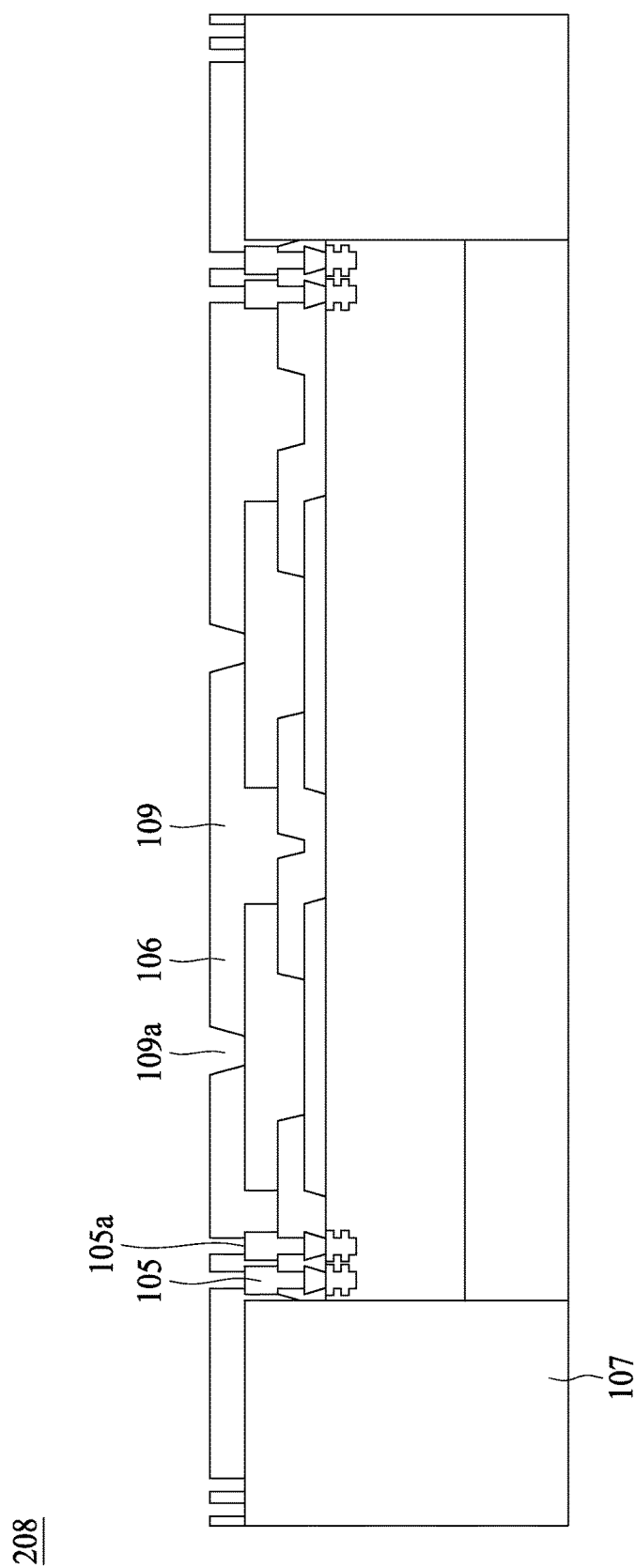

In operation 208, a dielectric 109 is disposed over molding 107, the conductor 105 and the dielectric 106 as in FIG. 3H. In some embodiments, the dielectric 109 includes a polymeric material such as epoxy, polyimide, polybenzoxazole (PBO), solder resist (SR), ABF film, and the like. In some embodiments, a recess 109a is formed above the top surface 105a of the conductor 105 as in FIG. 3H. In some embodiments, some of the dielectric 109 above the top surface 105a are removed by etching.

Figure 3I:
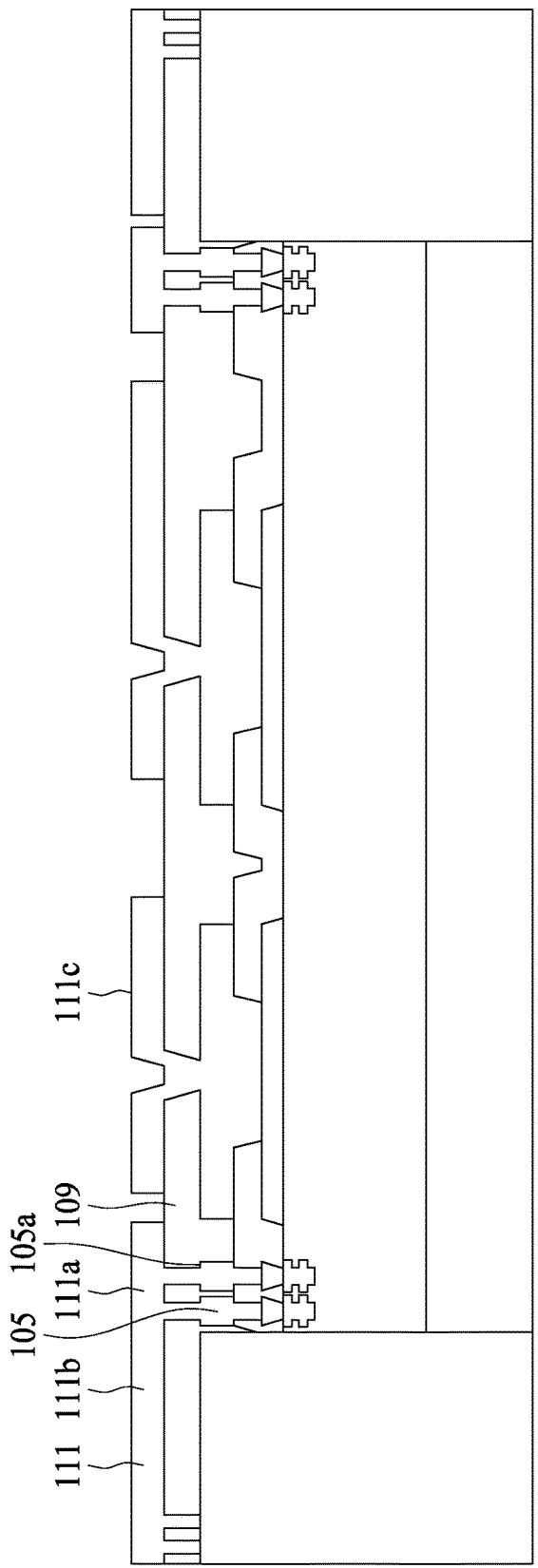

In operation 209, a conductive trace 111 is disposed as in FIG. 3I. In some embodiments, the conductive trace 111 is disposed on the dielectric 109 by electroplating or sputtering.

Figure 3J:
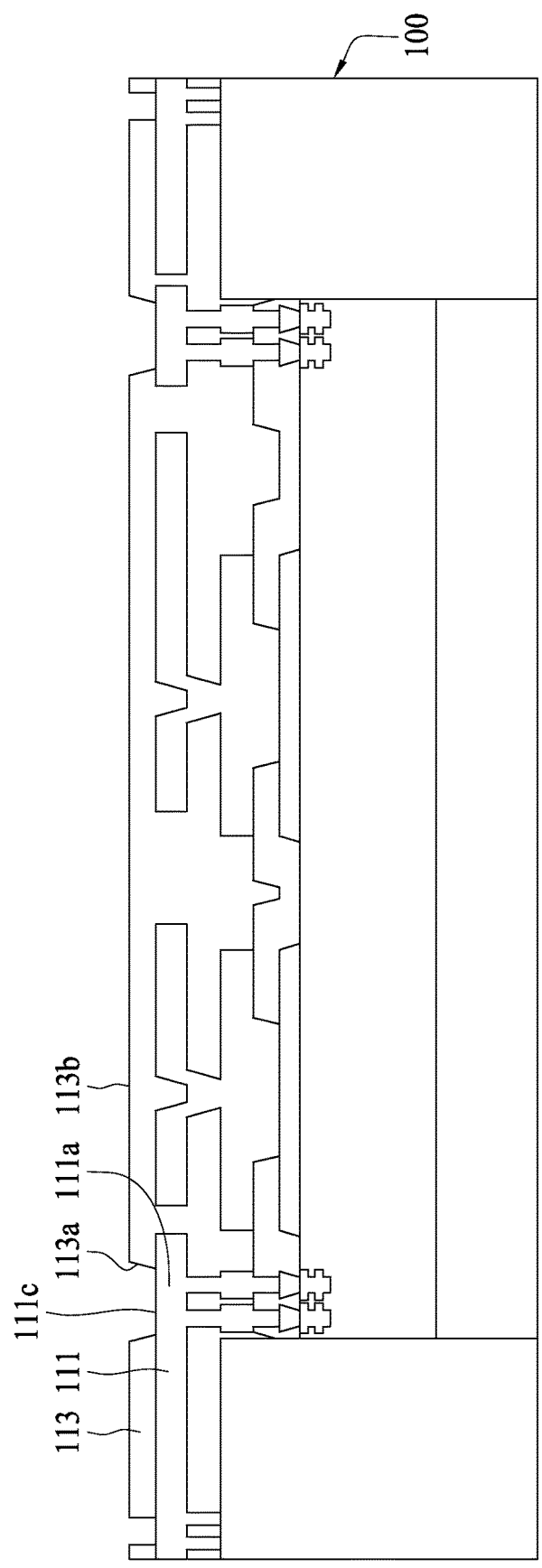

In operation 210, a dielectric 113 is disposed and a recess 113a is formed as in FIG. 3J. In some embodiments, the dielectric 113 is disposed on the conductive trace 111. The dielectric 113 covers the top of the semiconductor device 100. In some embodiments, the dielectric 113 includes a polymeric material such as epoxy, polyimide, polybenzoxazole (PBO), solder resist (SR), ABF film, and the like.

In some embodiments, the recess 113a is formed by partially removing the dielectric 113. In some embodiments, a portion of the dielectric 113 is removed by etching to form the opening 113a. In some embodiments, the recess 113a is in a tapered configuration. In some embodiments, the recess 113a is extended from a top surface 113b of the dielectric 113 to a top surface 111c of the conductive trace 111. In some embodiments, the opening 113a is extended on the top surface 111c.

Figure 3K:
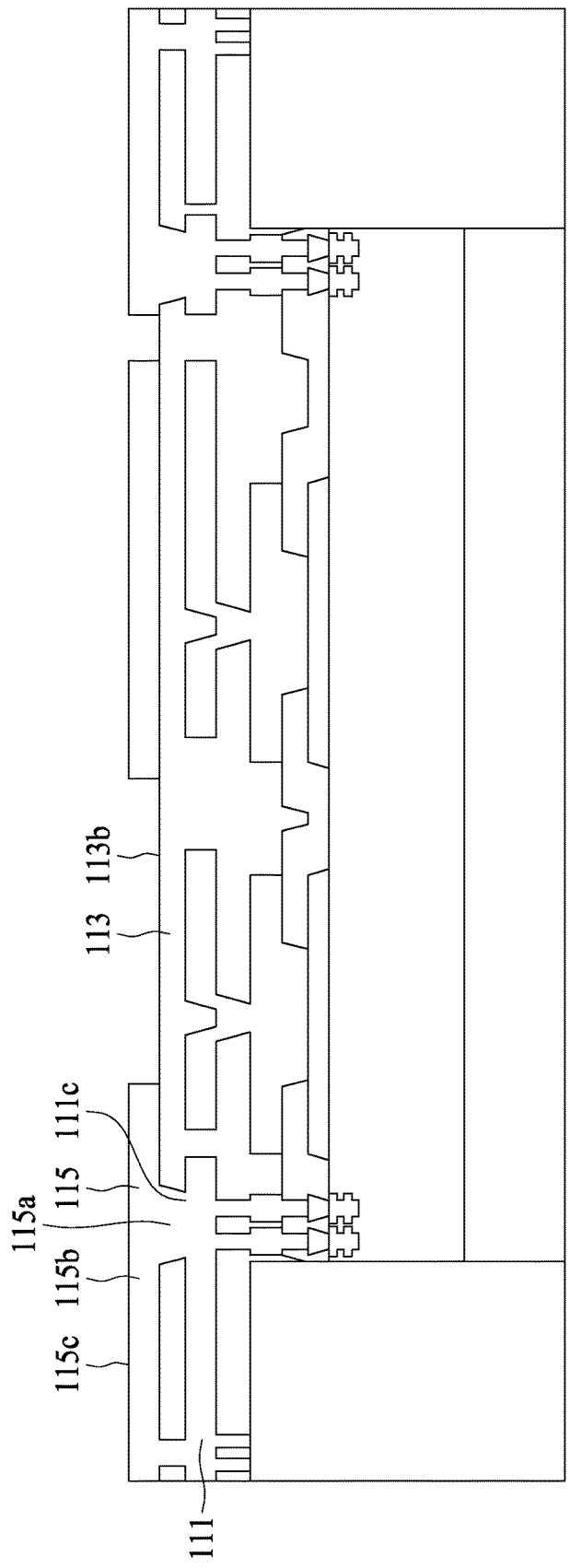

In operation 211, a conductive feature 115 is disposed as in FIG. 3K. In some embodiments, the conductive feature 115 is disposed on the dielectric 113 by electroplating or sputtering.

Figure 3L:
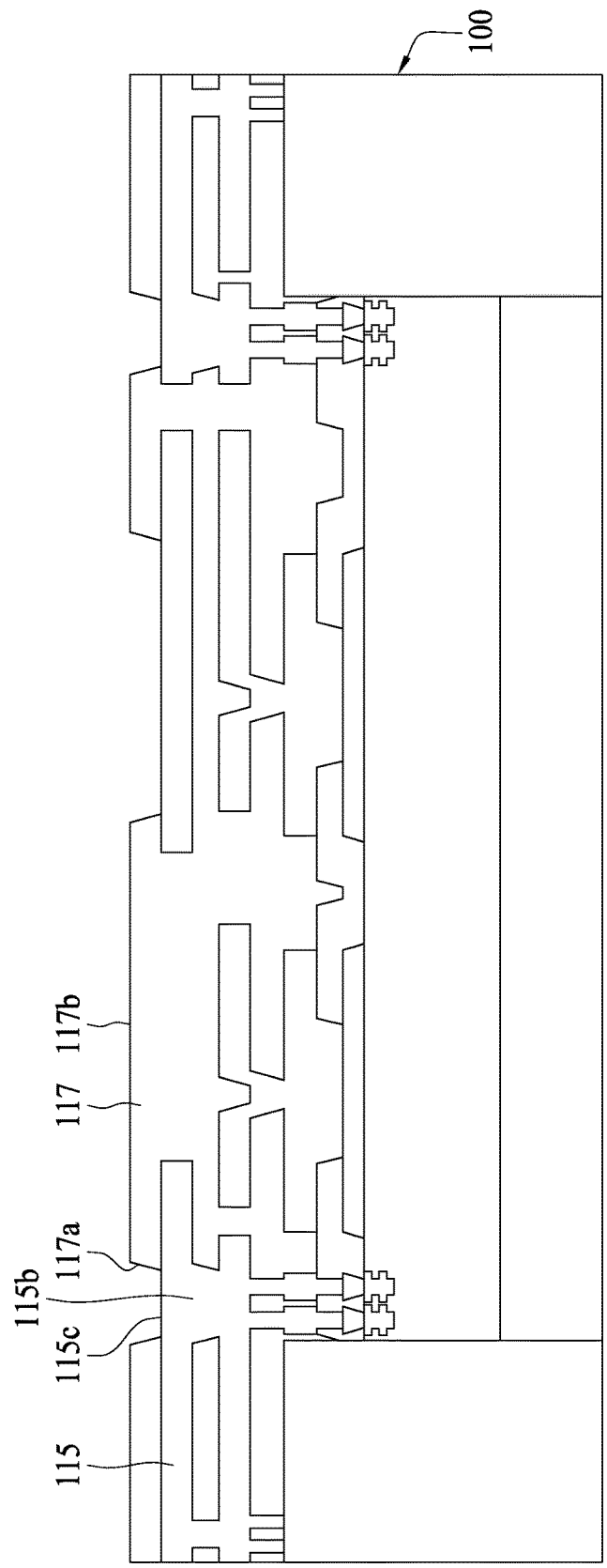

In operation 212, a dielectric 117 is disposed and a recess 117a is formed as in FIG. 3L. In some embodiments, the dielectric 117 is disposed on the conductive feature 115. In some embodiments, the dielectric 117 includes a polymeric material such as epoxy, polyimide, polybenzoxazole (PBO), solder resist (SR), ABF film, and the like.

In some embodiments, the recess 117a is formed by removing some of the dielectric 117 above the conductive feature 115. In some embodiments, some of the dielectric 117 is removed by etching to form the opening 117a. In some embodiments, the opening 117a is in a tapered configuration.

Figure 3M:
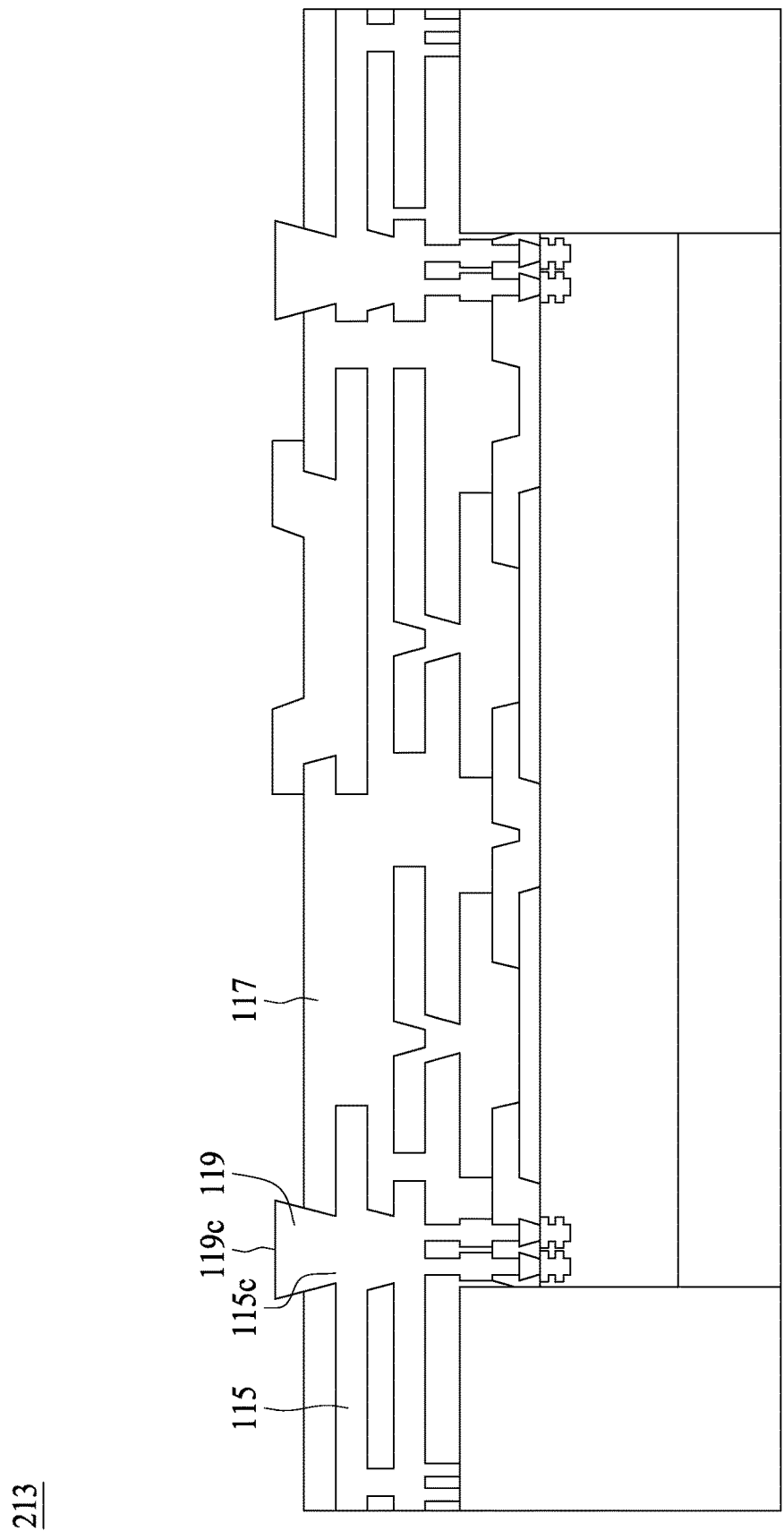

In operation 213, a conductive feature 119 is disposed as in FIG. 3M. In some embodiments, the conductive feature 119 is disposed on the dielectric 117 by electroplating or sputtering.

Figure 3N:
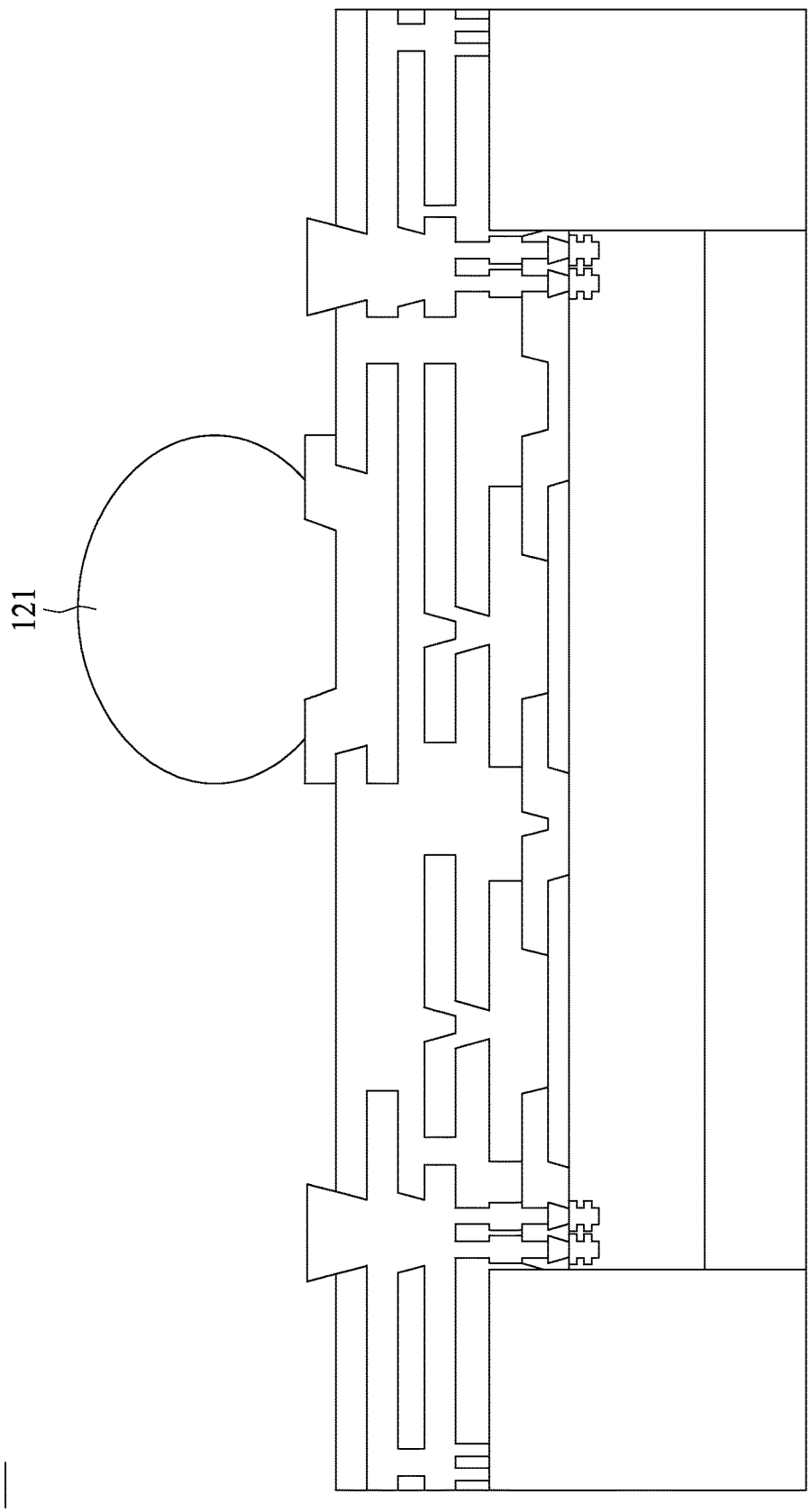

In operation 214, a bump 121 is disposed on another conductive trace as in FIG. 3N. In some embodiments, the bump 121 is a solder bump, solder ball, solder paste or etc. In some embodiments, the bump 121 is configured for attaching with a pad on another die, another substrate or another semiconductor package. In some embodiments, the bump 121 is a conductive bump or a conductive joint.

Figure 3O:
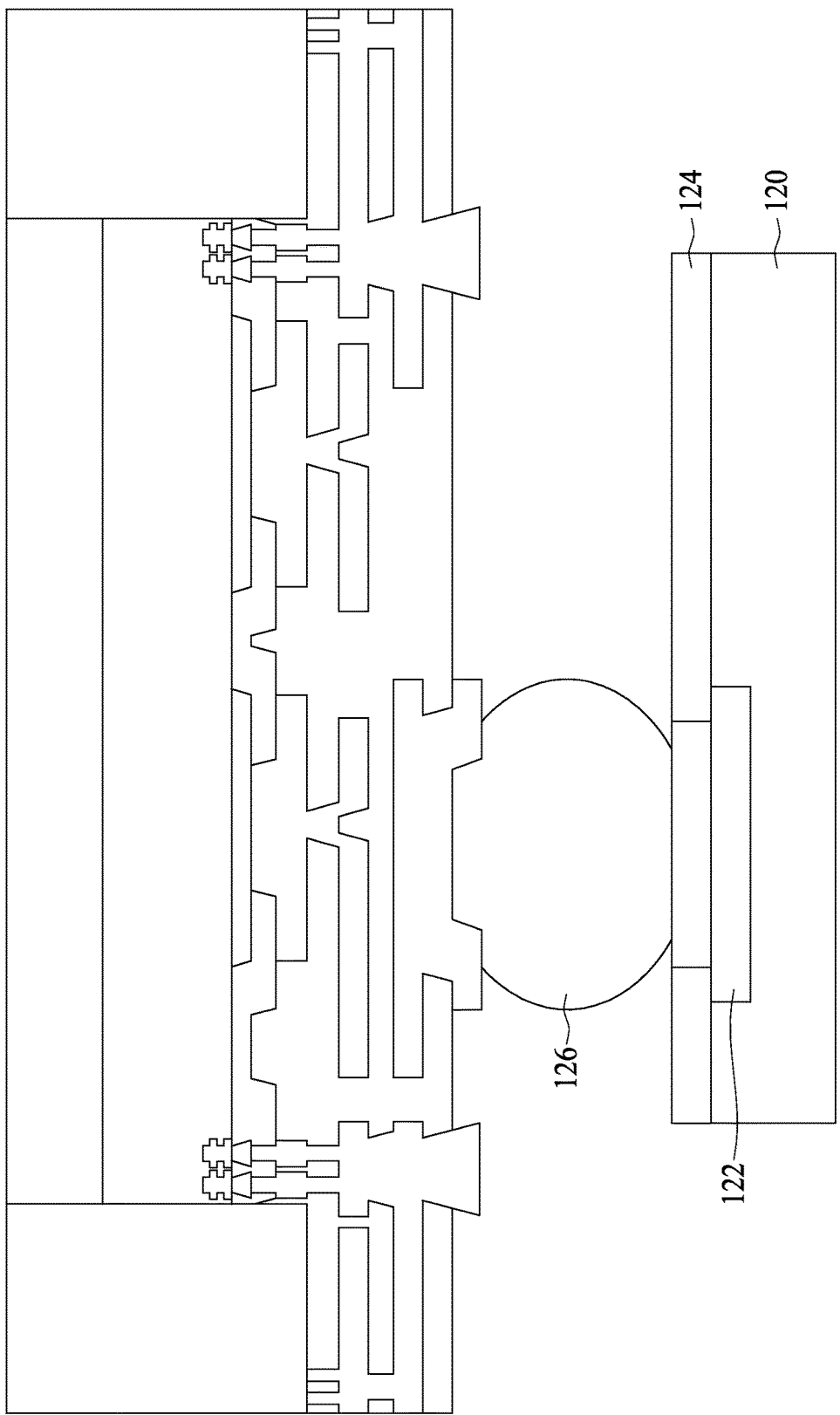

In operation 215, the carrier (not shown) is removed from the semiconductor device 100. The structure shown in FIG. 3N is flipped upside down and attached to another electronic component 150 at the bottom of FIG. 3O. The electronic component 150 may be a package substrate, board (e.g., a printed circuit board (PCB)), a wafer, a die, an interposer substrate, or other suitable substrate. The bump structure is coupled to the electronic component 150 through various conductive attachment points. For example, a conductive region 122 is formed and patterned on the electronic component 150. The conductive region 122 is a contact pad or a portion of a conductive trace, which is presented by a mask layer 124. In one embodiment, the mask layer 124 is a solder resist layer formed and patterned on the electronic component 150 to expose the conductive region 122. The mask layer 124 has a mask opening, which provides a window for solder joint formation. For example, a solder layer including alloys of tin, lead, silver, copper, nickel, bismuth, or combinations thereof may be provided on the conductive region 122. The semiconductor device 100 can be coupled to the electronic component 150 through a joint solder structure 126 between the conductive trace 111 and the conductive region 122. An exemplary coupling process includes a flux application, chip placement, reflowing of melting solder joints, and/or cleaning of flux residue. The semiconductor substrate 102, the joint solder structure 126, and the other electronic component 150 may be referred to as a packaging assembly, or in the present embodiment, a flip-chip packaging assembly.

In operation 216, a molding 143 is formed over the semiconductor device 100 to surround the electronic component 150. In some embodiments, a shield coating operation may further be applied to form an EMI shield 125 in an outside of the semiconductor device 100.

In some embodiments, a semiconductor device includes a semiconductor die having a guard ring disposed in a periphery of the semiconductor die. The semiconductor device also includes a conductive pad over the guard ring. the semiconductor device further has a passivation partially covering the conductive pad, and including a recess to expose a portion of the conductive pad and a post passivation interconnect (PPI) over the passivation. In the semiconductor device, a conductor is extended upwardly from the recess and connected to a portion of the PPI.

In some embodiments, a semiconductor device includes a semiconductor die having a guard ring disposed in a periphery of the semiconductor die and a conductive pad over the guard ring. The semiconductor device further has a passivation partially covering the conductive pad, and including a recess to expose a portion of the conductive pad. The semiconductor device also includes a post passivation interconnect (PPI) over the passivation and a conductor extended upwardly from the recess and connected to a portion of the PPI. In the semiconductor device, an EMI (Electromagnetic Interference) shield surrounds the semiconductor die and electrically coupled with the conductor via the PPI.

In some embodiments, a semiconductor device includes an EMI (Electromagnetic Interference) shield and a molded semiconductor structure in the EMI shield. The molded semiconductor structure includes a seal ring proximal to an edge of the molded semiconductor structure and electrically coupled to the EMI shield. The molded semiconductor structure further includes a semiconductor die electrically coupled to the seal ring through a conductor. In the semiconductor device, the semiconductor die has a guard ring electrically coupled to the conductor through a conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor die comprising a guard ring disposed in a periphery of the semiconductor die;
   a conductive pad over the guard ring;
   a passivation partially covering the conductive pad, and including a recess to expose a portion of the conductive pad;
   a post passivation interconnect (PPI) over the passivation; and
   a conductor extended upwardly from the recess and connected to a portion of the PPI.

2. The semiconductor device in claim 1, wherein the periphery is proximal to an edge of the semiconductor die.

3. The semiconductor device in claim 2 further comprising a molding adjacent the edge of the semiconductor die.

4. The semiconductor device in claim 1, wherein the conductor is electrically coupled to the guard ring via the conductive pad.

5. The semiconductor device in claim 1, wherein the semiconductor die comprises an interconnection in which the guard ring is disposed.

6. The semiconductor device in claim 1, further comprising a molding surrounding the semiconductor die, wherein a surface of the molding is coplanar with a surface of the conductor.

7. The semiconductor device in claim 1, further comprising another semiconductor die stacking over the semiconductor die, wherein both dies are electrically communicated via the PPI.

8. The semiconductor device in claim 7, wherein the conductor is extended substantially parallel to a stacking direction of both dies.

9. The semiconductor device in claim 1, further comprising a dielectric between the PPI and the passivation.

10. The semiconductor device in claim 1, wherein the dielectric includes a photo sensitive material.

11. The semiconductor device in claim 1, further comprising an EMI (Electromagnetic Interference) shield surrounding the semiconductor die and electrically coupled with the conductor via the PPI.

12. The semiconductor device in claim 11, wherein a portion of the PPI is extended laterally and in contact with the EMI shield.

13. The semiconductor device in claim 1, further comprising a molding surrounding the semiconductor die, wherein the molding is in contact with an edge of the semiconductor die at a first surface and in contact with the EMI shield at a second surface, the first surface is opposite to the second surface.

14. The semiconductor device in claim 11, wherein the semiconductor die comprises an interconnect and the guard ring is partially exposed from a top level dielectric of the interconnect.

15. The semiconductor device in claim 11, wherein the guard ring is a multi-leveled conductive structure and all levels are edge aligned.

16. The semiconductor device in claim 11, wherein the guard ring is electrically coupled to a ground terminal of the semiconductor device.

17. A semiconductor device, comprising:
    a semiconductor die comprising a guard ring disposed in a periphery of the semiconductor die;
    a conductive pad over the guard ring;
    a post passivation interconnect (PPI) over the conductive pad;
    a conductor extended upwardly from the conductive pad and connected to a first portion of the PPI; and
    a molding surrounding the semiconductor die.

18. The semiconductor device in claim 17, wherein a second portion of the PPI is laterally extended and exceeds an edge of the semiconductor die.

19. The semiconductor device in claim 18, wherein the second portion of the PPI is connected to an EMI (Electromagnetic Interference) shield.

20. The semiconductor device in claim 19, wherein the molding is in contact with the EMI shield.

* * * * *